(12) United States Patent
Kamei et al.

(10) Patent No.: US 9,053,819 B2
(45) Date of Patent: Jun. 9, 2015

(54) PROGRAMMING METHOD TO TIGHTEN THRESHOLD VOLTAGE WIDTH WITH AVOIDING PROGRAM DISTURB

(75) Inventors: Teruhiko Kamei, Kanagawa (JP); Cuong Trinh, Fremont, CA (US); Atsushi Inoue, Tokyo (JP); Toshiyuki Takahashi, Fujisawa (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 386 days.

(21) Appl. No.: 13/546,553

(22) Filed: Jul. 11, 2012

(65) Prior Publication Data

US 2014/0016415 A1 Jan. 16, 2014

(51) Int. Cl.
*G11C 11/00* (2006.01)
*G11C 11/56* (2006.01)
*G11C 16/34* (2006.01)

(52) U.S. Cl.
CPC ........ *G11C 11/5628* (2013.01); *G11C 16/3418* (2013.01); *G11C 16/3427* (2013.01)

(58) Field of Classification Search
CPC ........... G11C 11/5628; G11C 16/3418; G11C 16/3427
USPC ............................ 365/185.18, 185.03, 185.19
See application file for complete search history.

(56) References Cited

U.S. PATENT DOCUMENTS

| | | | |
|---|---|---|---|
| 7,564,711 B2 | 7/2009 | Mokhlesi | |
| 8,059,456 B2 | 11/2011 | Shlick et al. | |
| 2004/0052114 A1 | 3/2004 | Kobayashi et al. | |
| 2005/0169057 A1 | 8/2005 | Shibata et al. | |
| 2007/0086244 A1 | 4/2007 | Zilberman | |
| 2007/0279989 A1 | 12/2007 | Aritome | |
| 2010/0103734 A1* | 4/2010 | Hemink | 365/185.03 |

FOREIGN PATENT DOCUMENTS

EP 1271553 1/2003

OTHER PUBLICATIONS

PCT International Search Report dated Oct. 16, 2013, PCT Patent Application No. PCT/US2013/049712.
PCT Written Opinion of the International Searching Authority dated Oct. 16, 2013, PCT Patent Application No. PCT/US2013/049712.
Amendment to Claims under Article 19 dated Dec. 16, 2013, PCT Patent Application No. PCT/US2013/049712.

* cited by examiner

*Primary Examiner* — Richard Elms
*Assistant Examiner* — Mohammed A Bashar
(74) *Attorney, Agent, or Firm* — Vierra Magen Marcus LLP

(57) ABSTRACT

A non-volatile storage system that performs a multi-stage programming process to program non-volatile storage to a set of data threshold voltage distributions. The multi-stage programming process includes performing a first stage of the multi-stage programming process to change threshold voltages of at least a subset of the non-volatile storage elements from an erased distribution to one or more intermediate distributions, performing an intermediate stage of the multi-stage programming process to change threshold voltages of at least some of the non-volatile storage elements to appropriate distributions of the data threshold voltage distributions, and performing a later stage of the multi-stage programming process, after performing the intermediate stage of the multi-stage programming process, to tighten only a subset of the data threshold voltage distributions.

23 Claims, 12 Drawing Sheets

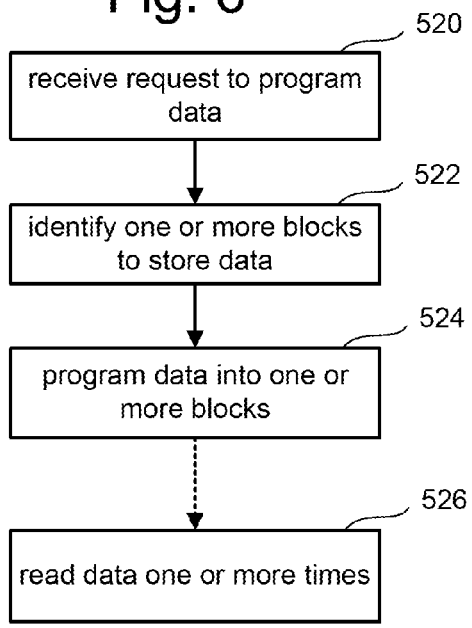
Fig. 6
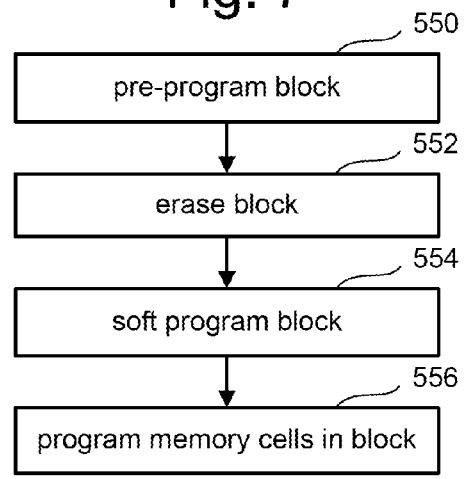
Fig. 7
Fig. 11
| state | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 4th Top Page | 1 | 0 | 0 | 1 | 1 | 0 | 0 | 1 | 1 | 0 | 0 | 1 | 1 | 0 | 0 | 1 |
| 3rd Higher Page | 1 | 1 | 0 | 0 | 0 | 0 | 1 | 1 | 1 | 1 | 0 | 0 | 0 | 0 | 1 | 1 |
| 2nd Upper Page | 1 | 1 | 1 | 1 | 0 | 0 | 0 | 0 | 0 | 0 | 0 | 0 | 1 | 1 | 1 | 1 |
| 1st Lower Page | 1 | 1 | 1 | 1 | 1 | 1 | 1 | 1 | 0 | 0 | 0 | 0 | 0 | 0 | 0 | 0 |

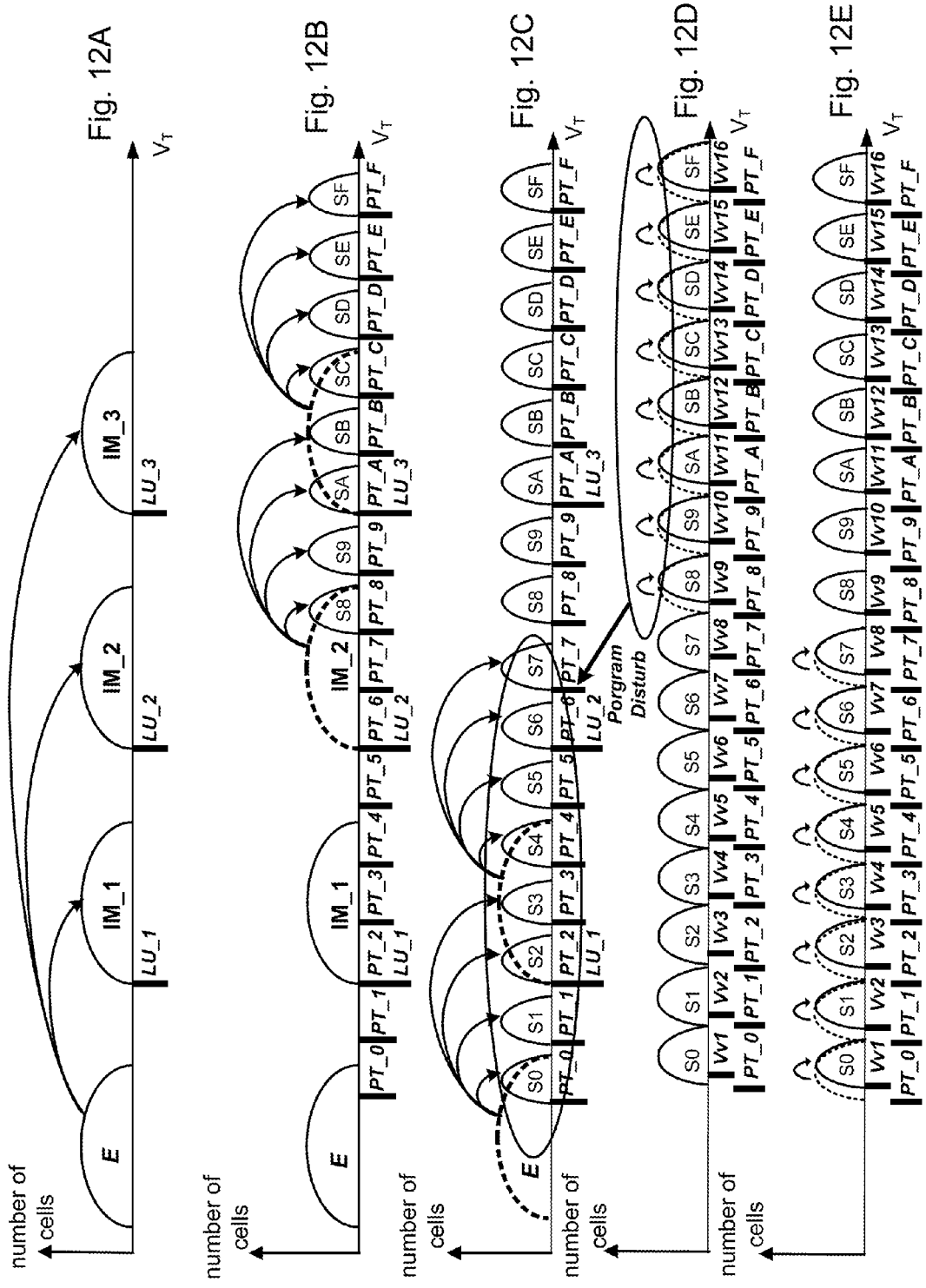

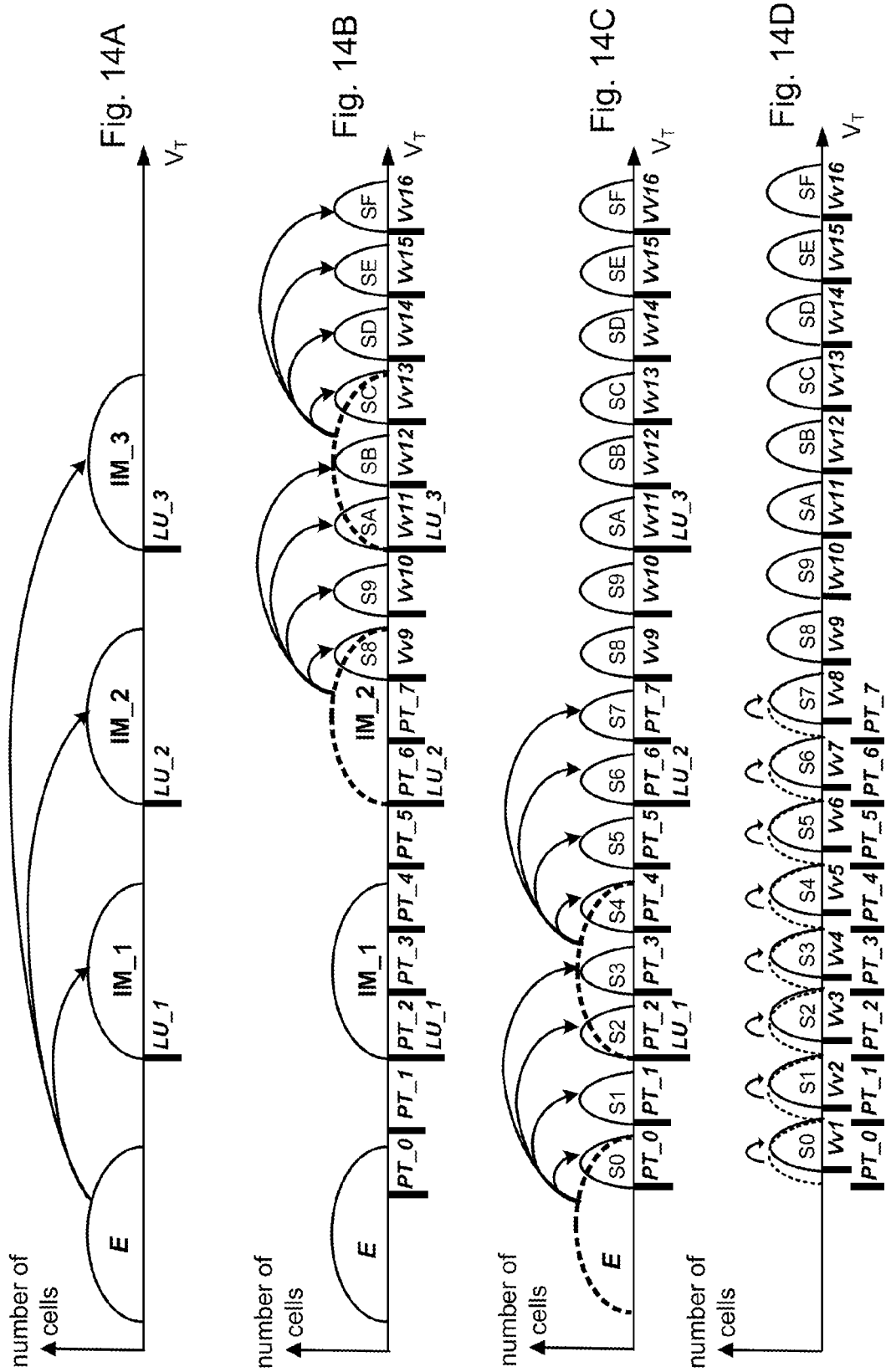

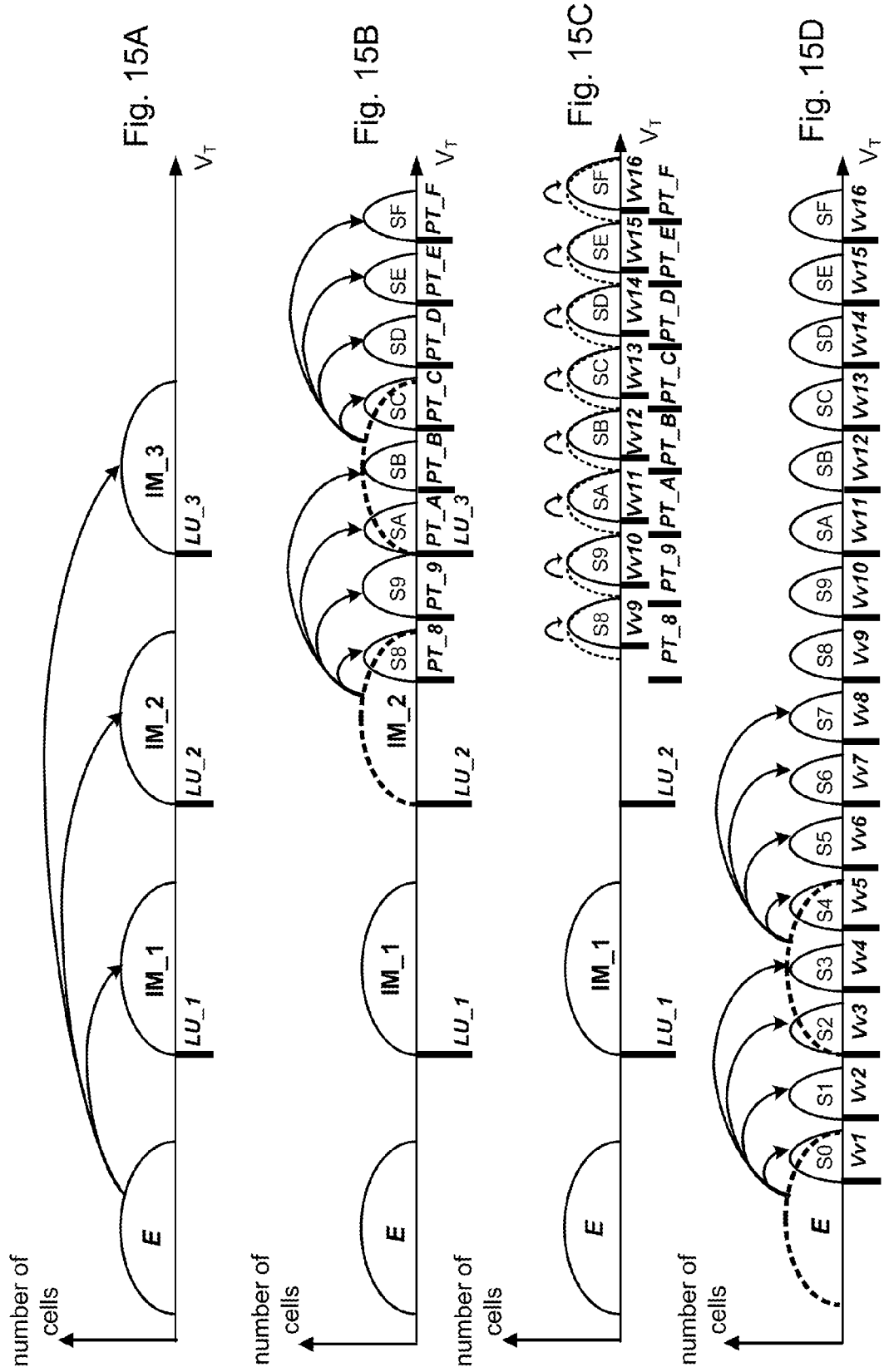

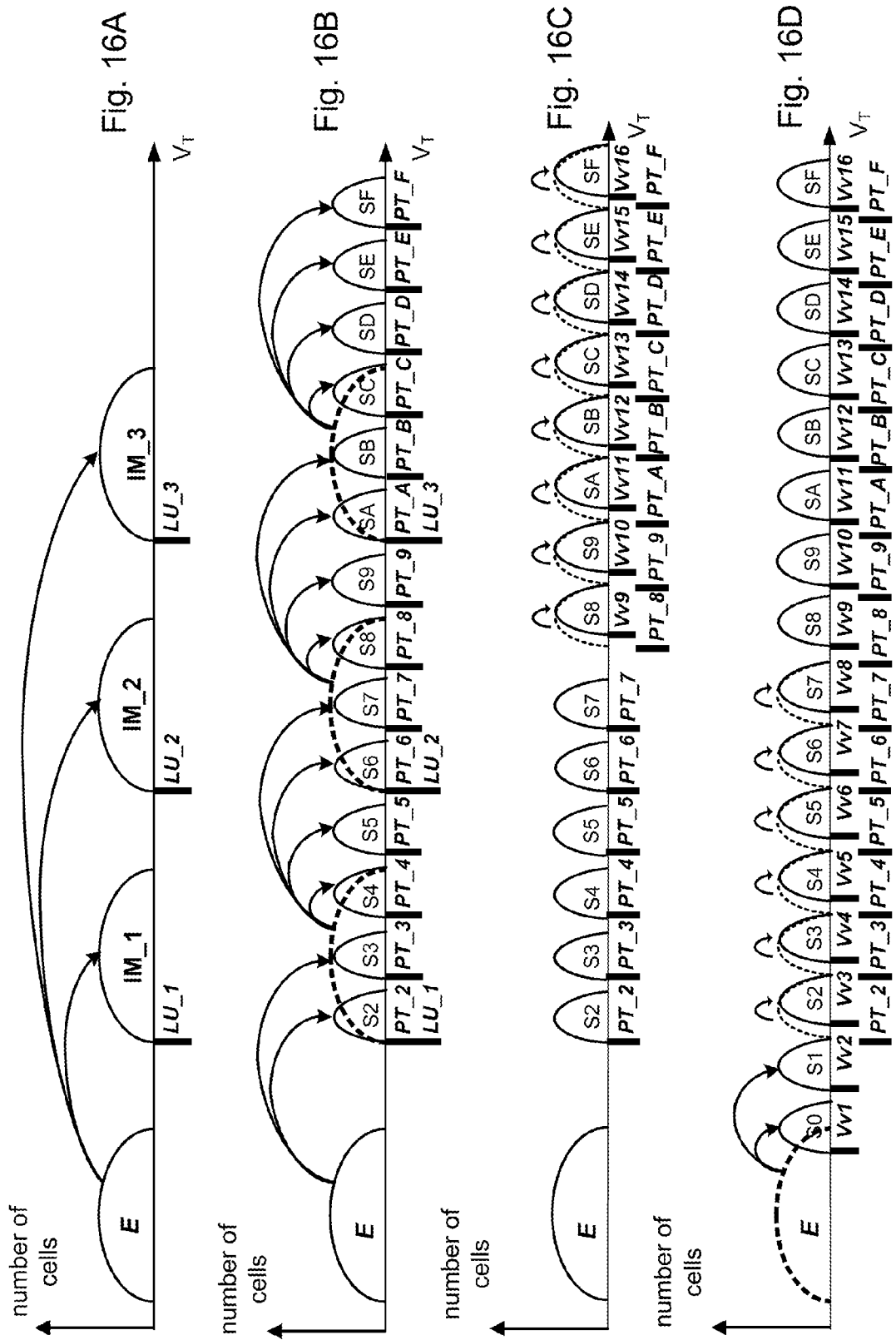

PROGRAMMING METHOD TO TIGHTEN THRESHOLD VOLTAGE WIDTH WITH AVOIDING PROGRAM DISTURB

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits encoded in the memory cell. Generally, N data bits per memory cell can be represented using $2^N$ threshold voltage ranges, also called data states. Using high number of data bits per memory cell allows producing Flash devices with high data density and thus reduces the overall cost per Flash device. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

Typically, the program voltage (Vpgm) is applied to the control gates of the memory cells as a series of pulses. The magnitude of the programming pulses is increased with each successive pulse by a predetermined step size (e.g. 0.2 v, 0.3 v, 0.4 v, or others). During a program operation, a high voltage is applied to the selected word line (WL) and 0 volts is applied to the selected bit line (BL), with the unselected WLs kept at conducting voltage and unselected BLs kept at some voltage that is lower than the programming voltage. A problem arises when it's desired to program one memory cell on a selected WL without programming other memory cells connected to the same word line. Because the program voltage is applied to all memory cells connected to a selected WL, an unselected memory cell (a memory cell that is not to be programmed) on the word line, especially a memory cell adjacent to the memory cell selected for programming, may become inadvertently programmed. The unintentional programming of the unselected memory cell on the selected WL is referred to as "program disturb." Program disturb is generally worse in the low voltage level memory cells and is increased when using higher programming voltages.

Another problem is the floating gate to floating gate coupling. The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

When programming data to multiple states (e.g., rather than binary programming), it is important that the programming process be sufficiently precise so that the read process can unambiguously distinguish between the different threshold voltage distributions. The precision of programming is related to the distribution of threshold voltages of the programmed memory cells subsequent to the programming process. The tighter the threshold voltage distribution, the easier it is to unambiguously read the memory cells. To obtain a tight threshold voltage distribution, many number of programming pulses are used. Using a high number of programming pulses causes a high programming voltage applied to the WL during the program operation, which can cause (in some cases) more program disturb.

BRIEF DESCRIPTION OF THE DRAWINGS

FIG. 6 is a flow chart describing one embodiment of a process for programming.

FIG. 7 is a flow chart describing one embodiment of a process for programming data into a block of memory cells.

FIG. 11 depicts an example coding of data into a set of data states associated with threshold voltage distributions.

FIGS. 12A-12E illustrate one example of a multi-stage programming.

FIGS. 14A-14D describe a multi-stage programming according to one embodiment of the present technology.

FIGS. 15A-15D describe a multi-stage programming according to another embodiment of the present technology.

FIGS. 16A-16D describe a multi-stage programming according to another embodiment of the present technology.

DETAILED DESCRIPTION

One solution for achieving tight threshold distributions with avoiding program disturb when programming a set of non-volatile storage elements is to use a multi-stage programming process. A first stage of the multi-stage programming process includes changing threshold voltages of at least a subset of the non-volatile storage elements from an erased distribution to one or more intermediate distributions. An intermediate stage of the multi-stage programming process includes changing threshold voltages of at least some of the non-volatile storage elements to appropriate distributions of the data threshold voltage distributions. A later stage of the multi-stage programming process, which is performed after performing the intermediate stage of the multi-stage programming process, includes tightening only a subset of the data threshold voltage distributions. In one embodiment, performing the intermediate stage of the multi-stage programming process comprises programming non-volatile storage elements to all distributions of the data threshold voltage distributions, and performing the later stage of the multi-stage programming process comprises tightening lower state data threshold voltage distributions without tightening upper state data threshold voltage distributions.

Figure 1:
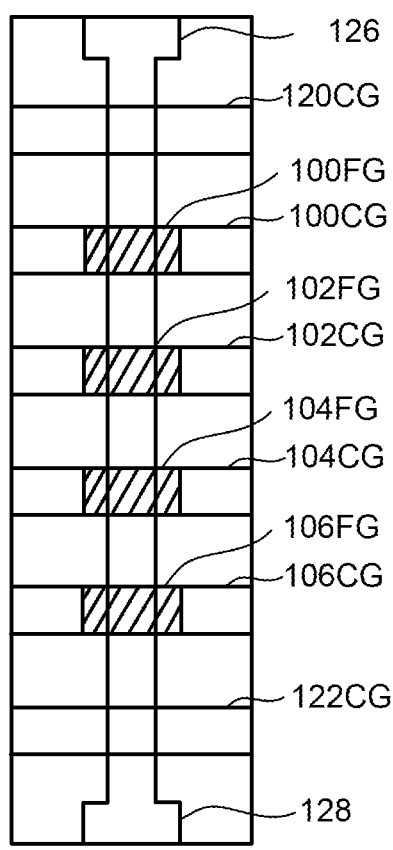
FIG. 1 is a top view of a NAND string.
Figure 2:
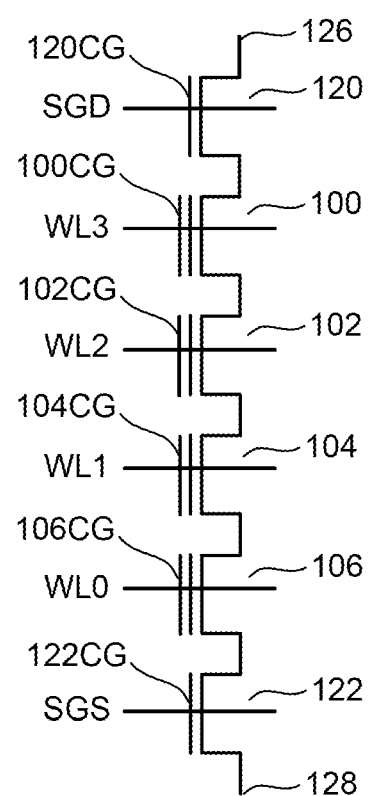
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a memory cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the memory cell channel into the nitride, where they are trapped and stored in a limited region. This stored charge then changes the threshold voltage of a portion of the channel of the memory cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor.

Figure 3:
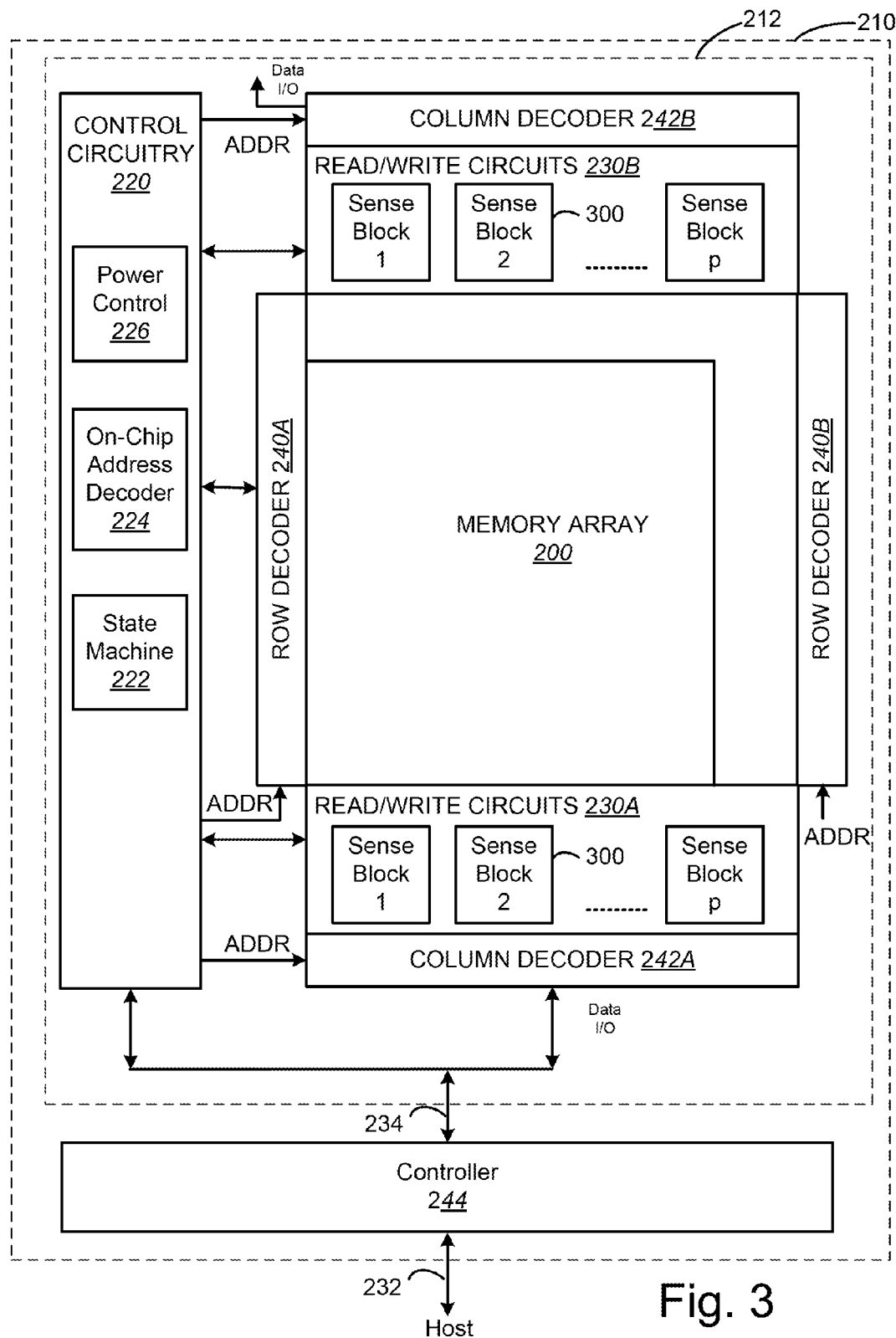
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
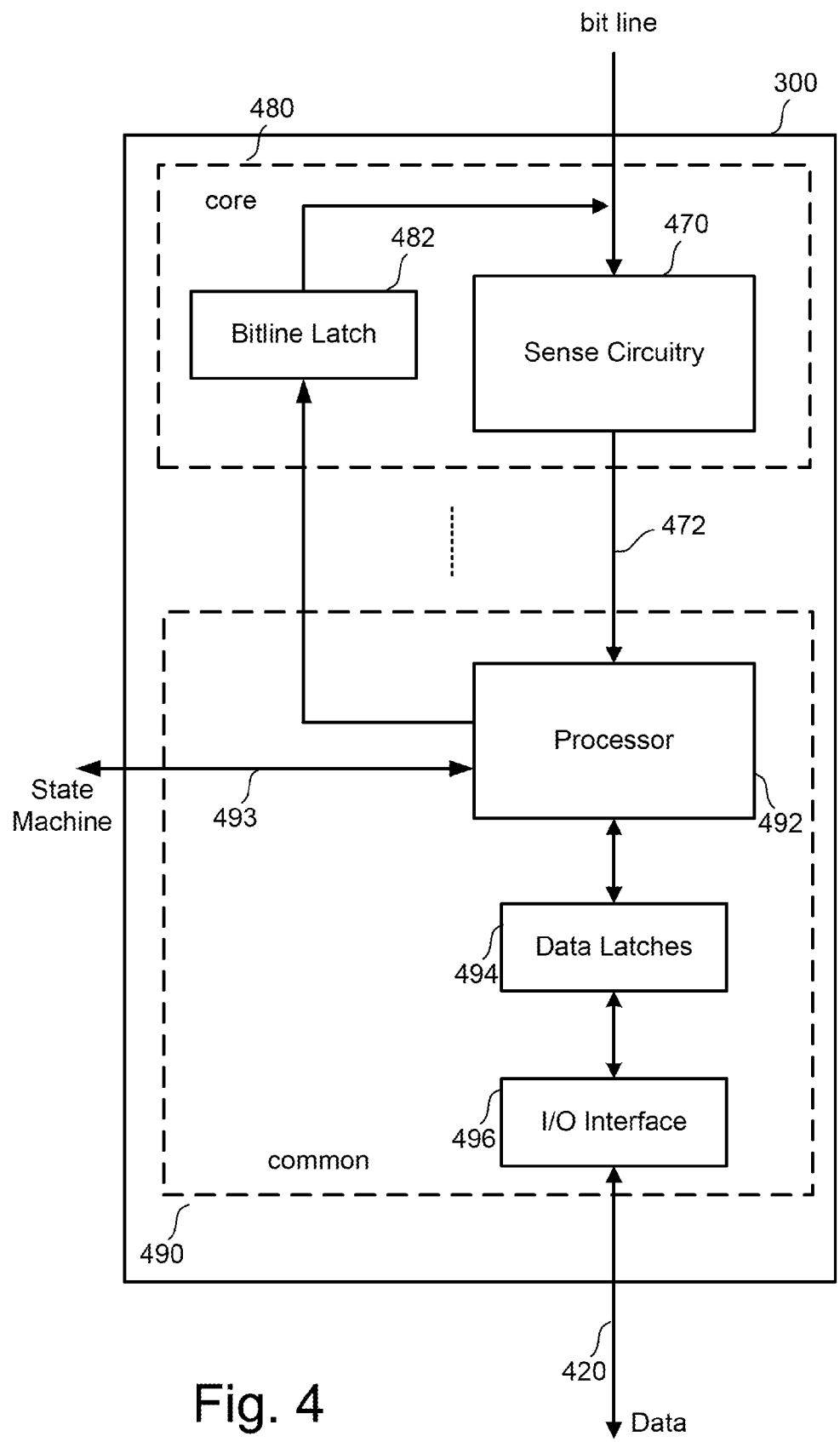
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed memory cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
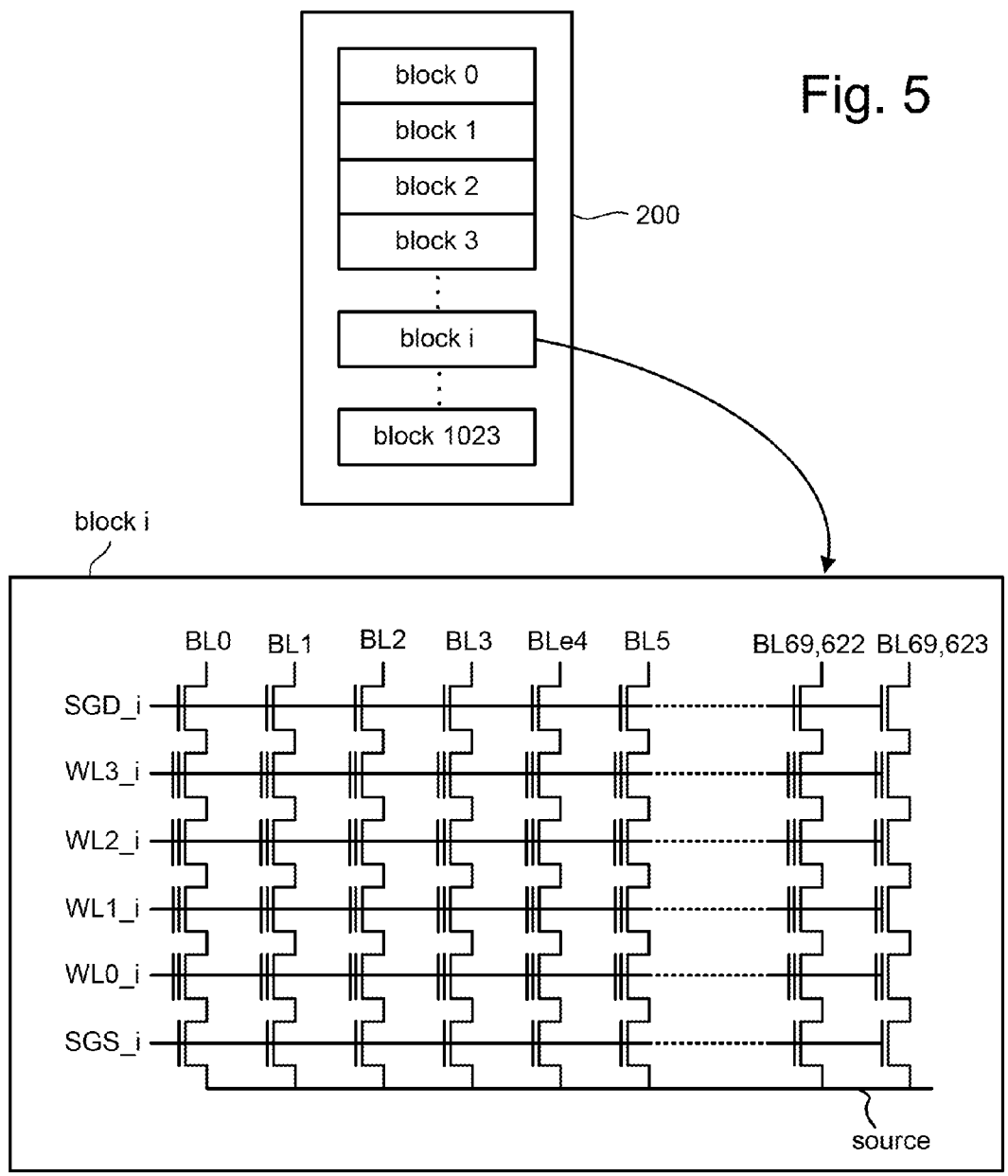
FIG. 5 is a block diagram depicting one embodiment of a memory array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four memory cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Some memory cells are slower to program or erase than others because of manufacturing variations among those memory cells, because those memory cells were previously erased to a lower threshold voltage than others, because of uneven wear among the memory cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed memory cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for programming. In step 520, a request for programming is received from the Host, the controller or other entity. In step 522, the controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected memory cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the controller using the various circuits described above.

Figure 8:
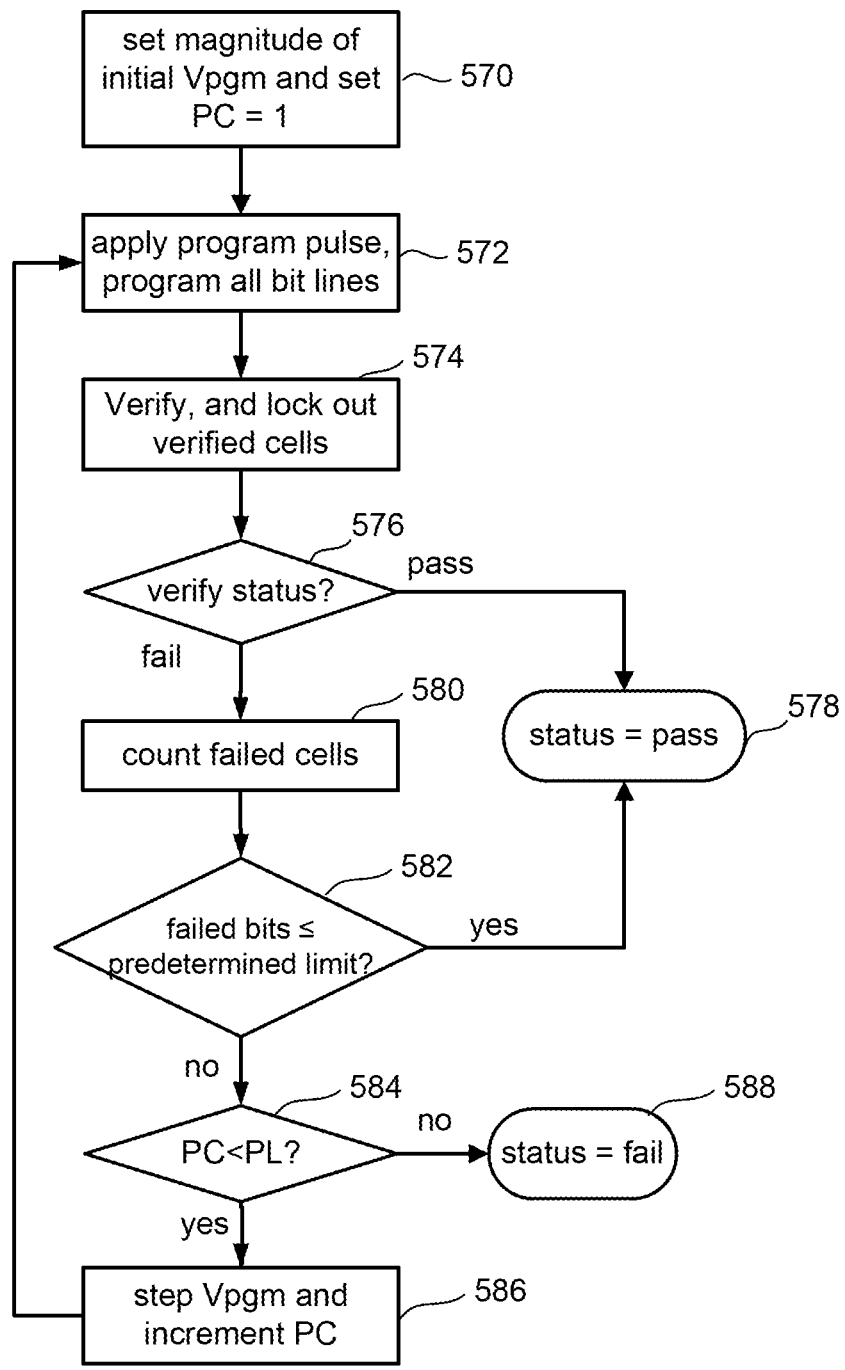
FIG. 8 is a flow chart describing one embodiment of a process for programming non-volatile memory.
Figure 10:
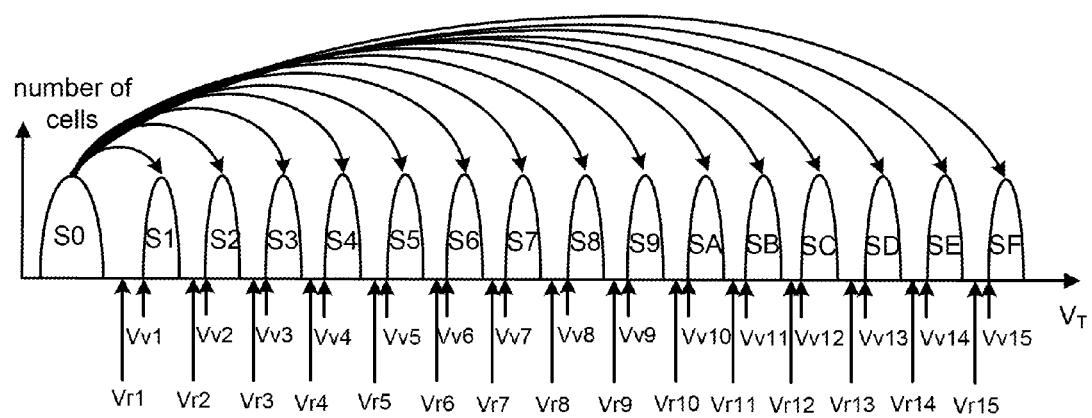
FIG. 10 depicts an example set of threshold voltage distributions and describes a process for programming non-volatile memory.

FIG. 8 is a flow chart describing one embodiment of a process for performing programming on memory cells connected to a common word line. The process of FIG. 8 can be performed one or multiple times during step 556 of FIG. 7. For example, the process of FIG. 8 can be used to program memory cells (e.g., full sequence programming) from data state S0 directly to any of data states S1-SF as shown in FIG. 10. Alternatively, the process of FIG. 8 can be used with a multi-phase programming process.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 8, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the testing whether the threshold voltages of the memory cells selected for programming have reached the appropriate verify compare voltage (FIG. 10 illustrates a set of verify compare voltages Vv1, Vv2, Vv3, Vv4, Vv5, Vv6, Vv7, Vv8, Vv9, Vv10, Vv11, Vv13, Vv13, Vv14, and Vv15).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have failed the verify process. This counting can be done by the state machine, the controller, or other logic. In one implementation, each of the sense block 300 (see FIG. 3) will store the status (pass/fail) of their respective memory cells. These values can be counted using a digital counter. As described above, many of the sense blocks have an output signal that is wire-Or'd together. Thus, checking one line can indicate that no memory cells of a large group of memory cells have failed verify. By appropriately organizing the lines being wired-Or together (e.g., a binary tree-like structure), a binary search method can be used to determine the number of memory cells that have failed. In such a manner, if a small number of memory cells failed, the counting is completed rapidly. If a large number of memory cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed memory cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed memory cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 9:
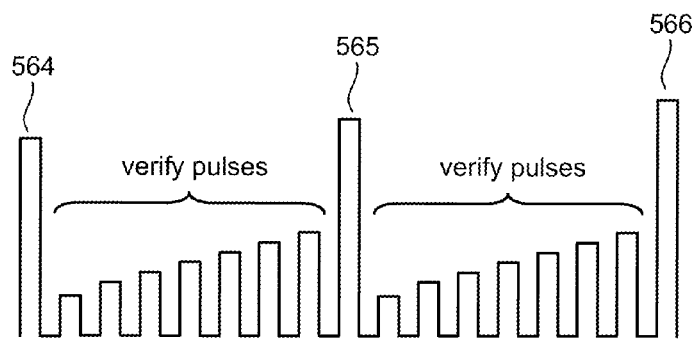
FIG. 9 depicts three programming pulses, and the verify pulses applied between the programming pulses.

In some embodiments, the program voltage applied to the control gate during a program operation includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states). For example, if a memory cell stores three bits of data, there are eight valid threshold voltage distributions (also called data states: S0, S1, S2, S3, S4, S5, S6 and S7). In this example, data is programmed from S0 (S0 is for erased memory cells) to S1-S7. Therefore, FIG. 9 shows seven verify pulses that have magnitudes corresponding to verify target levels Vv1, Vv2, Vv3, Vv4, Vv5, Vv6, and Vv7. Other embodiment, however, may use more or less than three bits of data per memory cell. For example, FIG. 10 illustrates example threshold voltage distributions corresponding to data states for the memory cell array when each memory cell stores four bits of data. Therefore, FIG. 10 shows sixteen threshold voltage distributions corresponding to data states S0-SF. In this embodiment, there would be fifteen verify pulses that have magnitudes corresponding to verify target levels Vv1, Vv2, Vv3, Vv4, Vv5, Vv6, Vv7, Vv8, Vv9, Vv10, Vv11, Vv13, Vv13, Vv14, Vv15.

In some embodiments, one or more of the verify operations can be skipped (and, therefore one or more of the verify pulses can be skipped) because the verify operation is not necessary or superfluous. For example, if none of the memory cells being programmed have reached Vv2, there is a very low probability to reach Vv7, thus verification at Vv7 is not necessary. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

At the end of a successful programming process (with verification), the threshold voltages of the memory cells should be within one or more distributions of threshold voltages for programmed memory cells or within a distribution of threshold voltages for erased memory cells, as appropriate. FIG. 10 illustrates example threshold voltage distributions for the memory cell array when each memory cell stores four bits of data. Other embodiments, however, may use more or less than four bits of data per memory cell (e.g., such as three bits of data per memory cell).

In the example of FIG. 10, each memory cell stores four bits of data; therefore, there are sixteen valid threshold voltage distributions, also called data states: S0, S1, S2, S3, S4, S5, S6, S7, S8, S9, SA, SB, SC, SD, SE and SF. In one embodiment, data state S0 is below 0 volts and data states S1-SF are above 0 volts. In other embodiments, all sixteen data states are above 0 volts, or other arrangements can be implemented. In one embodiment, the threshold voltage distribution for S0 is wider than for S1-SF.

In some devices, the memory cells will be erased to state S0. From state S0, the memory cells can be programmed to any of states S1-SF. In one embodiment, known as full sequence programming, memory cells can be programmed from the erased state S0 directly to any of the programmed states S1-SF. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, state S0 to state S7, state S0 to S8, state S0 to S9, state S0 to SA, state S0 to SB, state S0 to SC, state S0 to SD, state S0 to SE and state S0 to SF. Full sequence programming is graphically depicted by the fifteen curved arrows of FIG. 10.

FIG. 10 shows a set of verify target levels Vv1, Vv2, Vv3, Vv4, Vv5, Vv6, Vv7, Vv8, Vv9, Vv10, Vv11, Vv12, Vv13, Vv14, and Vv15. These verify levels are used as comparison levels (also known as target levels) during the programming process. For example, when programming memory cells to data state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to data state S2. Verify target level Vv3 is used for memory cells being programmed to data state S3. Verify target level Vv4 is used for memory cells being programmed to data state S4. Verify target level Vv5 is used for memory cells being programmed to data state S5. Verify target level Vv6 is used for memory cells being programmed to data state S6. Verify target level Vv7 is used for memory cells being programmed to data state S7. Verify target level Vv8 is used for memory cells being programmed to data state S8. Verify target level Vv9 is used for memory cells being programmed to data state S9. Verify target level Vv10 is used for memory cells being programmed to data state SA. Verify target level Vv11 is used for memory cells being programmed to data state SB. Verify target level Vv12 is used for memory cells being programmed to data state SC. Verify target level Vv13 is used for memory cells being programmed to data state SD. Verify target level Vv14 is used for memory cells being programmed to data state SE. Verify target level Vv15 is used for memory cells being programmed to data state SF.

FIG. 10 also shows a set of read compare levels Vr1, Vr2, Vr3, Vr4, Vr5, Vr6, Vr7, Vr8, Vr9, Vr10, Vr11, Vr12, Vr13, Vr14, and Vr15. These read compare levels are used as comparison levels during the read process. By testing whether the memory cells turn on or remain off in response to the read compare levels Vr1, Vr2, Vr3, Vr4, Vr5, Vr6, Vr7, Vr8, Vr9, Vr10, Vr11, Vr12, Vr13, Vr14, and Vr15 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, Vr7, Vr8, Vr9, Vr10, Vr11, Vr12, Vr13, Vr14, and Vr15 of FIG. 10) or verify operation (e.g. see verify target levels Vv1, Vv2, Vv3, Vv4, Vv5, Vv6, Vv7, Vv8, Vv9, Vv10, Vv11, Vv12, Vv13, Vv14, and Vv15 of FIG. 10) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Each data state of FIG. 10 corresponds to predetermined values for the data bits stored in the memory cells programmed to the respective states. FIG. 11 is a table providing an example of the data values assigned to each data state S0-SF. In one embodiment, a memory cell stores data in four different pages. The four pages are referred to as the $1^{st}$ lower page, $2^{nd}$ upper page, $3^{rd}$ higher page and $4^{th}$ top page. FIG. 11 depicts the data in each page for each data state S0-SF. In one embodiment, each page is programmed separately. In another embodiment, all four data bits for a memory cell are programmed at the same time. Other mapping of data to states S0-SF can also be used. The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells.

In one embodiment, the data values of FIG. 11 are assigned to the threshold voltage ranges using a Gray code assignment so that if the threshold voltage of a floating gate erroneously shifts to its neighboring threshold voltage distribution, only one bit will be affected. This arrangement reduces the number of error bits if the threshold voltage of a memory cells is too low or too high. However, in other embodiments, Gray code is not used.

When programming data to multiple states (e.g., rather than binary programming), it is important that the programming process be sufficiently precise so that the read process can unambiguously distinguish between the different threshold voltage distributions. For example, the tighter the threshold voltage distribution, the easier it is to unambiguously read the memory cells.

One solution for achieving tight threshold voltage distributions, without unreasonably slowing down the programming process, includes using a two-phase programming process. A coarse programming phase includes an attempt to raise a threshold voltage in a faster manner and paying less attention to achieving a tight threshold voltage distribution. A fine programming phase attempts to raise the threshold voltage in a slower manner in order to reach the target threshold voltage, while also achieving a tighter threshold voltage distribution. More information about coarse/fine programming can be found in the following patent documents that are incorporated herein by reference in their entirety: (1) U.S. Pat. No. 6,643,188; and (2) U.S. Pat. No. 7,092,290.

As noted earlier, the unintentional programming of unselected memory cells on a selected WL is known as "program disturb." Generally, lower data states suffer more program disturb than higher data states due to higher program voltages (Vpgm).

One solution for reducing program disturb includes programming higher/upper data states followed by programming lower data states (also known as high-state-first or "HSF" programming). For example, programming an 8-level memory cell device (S0 through S7) includes programming the higher states S4 through S7 first and programming the lower states S1 through S3 after the higher states are programmed. HSF reduces the program disturb effect on lower data states. This ordering of the programming of memory cells according to their target states is counter to the common art in which the programming progresses from low threshold states to high threshold states. More information about HSF programming can be found in U.S. Pat. No. 8,059,456, titled "Programming a NAND flash memory with reduced program disturb," incorporated herein by reference in the entirety.

To achieve tight threshold voltage distributions while avoiding program disturb, one solution is to combine the coarse/fine programming with the HSF programming as described above. However, one drawback of this solution is that the lower states at the coarse programming phase may suffer from program disturb caused by the higher states programming at the fine programming phase, as described below in FIGS. 12A-12E.

FIGS. 12A-12E illustrates one example of a multi-stage programming approach. In this embodiment, the programming process includes three stages. Prior to programming, the memory cells are erased so that all memory cells connected to a common word line are in an erased threshold voltage distribution E. During the first stage of programming, at least a subset of the memory cells are programmed from the erased threshold voltage distribution E to one or more intermediate threshold voltage distributions. For example, as depicted in FIG. 12A, a first subset of the memory cells whose targets are data states S4 through S7 are programmed to an intermediate threshold voltage distribution IM_1 having a threshold voltage of LU_1, a second subset of the memory cells whose targets are data states S8 through SB are programmed to an intermediate threshold voltage distribution IM_2 having a threshold voltage of LU_2, a third subset of the memory cells whose targets are data states SC through SF are programmed to an intermediate threshold voltage distribution IM_3 having a threshold voltage of LU_3. In this example, those memory cells that are to be programmed to data states S0 through S3 are remain in the erased threshold voltage distribution E.

During the second stage (coarse programming) of the programming process of FIGS. 12A-12E, memory cells are first programmed to appropriate data threshold voltage distributions for the upper data states, as depicted in FIG. 12B. For example, as can be seen from FIG. 12B, those memory cells to be programmed to data state S8 are programmed from intermediate threshold voltage distribution IM_2 to a data threshold voltage distribution for data state S8, those memory cells to be programmed to data state S9 are programmed from intermediate threshold voltage distribution IM_2 to a data threshold voltage distribution for data state S9, those memory cells to be programmed to data state SA are programmed from intermediate threshold voltage distribution IM_2 to a data threshold voltage distribution for data state SA, and those memory cells to be programmed to data state SB are programmed from intermediate threshold voltage distribution IM_2 to a data threshold voltage distribution for data state SB. Likewise, those memory cells to be programmed to data state SC are programmed from intermediate threshold voltage distribution IM_3 to a data threshold voltage distribution for data state SC, those memory cells to be programmed to data state SD are programmed from intermediate threshold voltage distribution IM_3 to a data threshold voltage distribution for data state SD, those memory cells to be programmed to data state SE are programmed from intermediate threshold voltage distribution IM_3 to a data threshold voltage distribution for data state SE, and those memory cells to be programmed to data state SF are programmed from the intermediate threshold voltage distribution IM_3 to a data threshold voltage distribution for data state SF.

During the second stage (i.e., coarse programming), memory cells are subsequently programmed to appropriate data threshold voltage distributions for the lower data states after the programming to the upper data states. For example, as can be seen from FIG. 12C, those memory cells to be programmed to data state S0 are programmed from the erased threshold voltage distribution E to a data threshold voltage distribution for data state S0, those memory cells to be programmed to data state S1 are programmed from the erased threshold voltage distribution E to a data threshold voltage distribution for data state S1, those memory cells to be programmed to data state S2 are programmed from the erased threshold voltage distribution E to a data threshold voltage distribution for data state S2, and those memory cells to be programmed to data state S3 are programmed from the erased threshold voltage distribution E to a data threshold voltage distribution for data state S3. Likewise, those memory cells to be programmed to data state S4 are programmed from intermediate threshold voltage distribution IM_1 to a data threshold voltage distribution for data state S4, those memory cells to be programmed to data state S5 are programmed from intermediate threshold voltage distribution IM_1 to a data threshold voltage distribution for data state S5, those memory cells to be programmed to data state S6 are programmed from intermediate threshold voltage distribution IM_1 to a data threshold voltage distribution for data state S6, and those memory cells to be programmed to data state S7 are programmed from intermediate threshold voltage distribution IM_1 to a data threshold voltage distribution for data state S7.

As can be seen in FIG. 12C, at the end of the second stage of programming, all of the data states (state S0 through state SF) do not overlap with neighboring data states. In some embodiments, all or some of the data states may overlap with neighboring data states.

In the third stage (fine programming) of the programming process of FIGS. 12A-12E, the data threshold voltage distributions for the upper data states are tightened first. For example, as depicted in FIG. 12D, the data threshold voltage distribution for data state S8 is tightened to achieve a target threshold voltage distribution for data state S8 having a target threshold voltage of Vv9, the data threshold voltage distribution for data state S9 is tightened to achieve a target threshold voltage distribution for data state S9 having a target threshold voltage of Vv10, the data threshold voltage distribution for data state SA is tightened to achieve a target threshold voltage distribution for data state SA having a target threshold voltage of Vv11, the data threshold voltage distribution for data state SB is tightened to achieve a target threshold voltage distribution for data state SB having a target threshold voltage of Vv12, the data threshold voltage distribution for data state SC is tightened to achieve a target threshold voltage distribution for data state SC having a target threshold voltage of Vv13, the data threshold voltage distribution for data state SD is tightened to achieve a target threshold voltage distribution for data state SD having a target threshold voltage of Vv14, the data threshold voltage distribution for data state SE is tightened to achieve a target threshold voltage distribution for data state SE having a target threshold voltage of Vv15, and the data threshold voltage distribution for data state SF is tightened to achieve a target threshold voltage distribution data state SF having a target threshold voltage of Vv16.

During the third stage of programming, the data threshold voltage distributions for the lower data states are subsequently tightened after the tightening of the upper state data threshold voltage distributions. This is depicted graphically by FIG. 12E. For example, as depicted in FIG. 12E, the data threshold voltage distribution for data state S0 is tightened to achieve a target threshold voltage distribution data state S0 having a target threshold voltage of Vv1, the data threshold voltage distribution for data state S1 is tightened to achieve a target threshold voltage distribution data state S1 having a target threshold voltage of Vv2, the data threshold voltage distribution for data state S2 is tightened to achieve a target threshold voltage distribution data state S2 having a target threshold voltage of Vv3, the data threshold voltage distribution for data state S3 is tightened to achieve a target threshold voltage distribution for data state S3 having a target threshold voltage of Vv4, the data threshold voltage distribution for data state S4 is tightened to achieve a target threshold voltage distribution for data state S4 having a target threshold voltage of Vv5, the data threshold voltage distribution for data state S5 is tightened to achieve a target threshold voltage distribution for data state S5 having a target threshold voltage of Vv6, the data threshold voltage distribution for data state S6 is tightened to achieve a target threshold voltage distribution for data state S6 having a target threshold voltage of Vv7, and the data threshold voltage distribution for data state S7 is tightened to achieve a target threshold voltage distribution for data state S7 having a target threshold voltage of Vv8.

In some embodiments, some memory cells to be programmed to one or more data states are not programmed during the second stage of the programming process, and therefore, remain in an intermediate state. During the third programming stage, these memory cells are programmed from an intermediate state to their appropriate target data states. In other embodiments, memory cells destined for other target data states can also remain in the intermediate state or the erased threshold voltage distribution E during the second stage of the programming process.

As can be seen in FIGS. 12B-12E, high-state-first (HSF) programs the upper data states first and subsequently programs the lower data states in both the coarse programming phase and the fine programming phase. However, the lower data states at the coarse programming phase (See FIG. 12C) may suffer from program disturb caused by the programming of the upper data states at the fine programming phase (See FIG. 12D).

In order to tighten threshold voltage distribution while avoiding program disturb (e.g., the program disturb as depicted in the programming process of FIGS. 12A-12E), the system described herein masks data for one or more data states during the programming process, as described in detail below.

Figure 13:
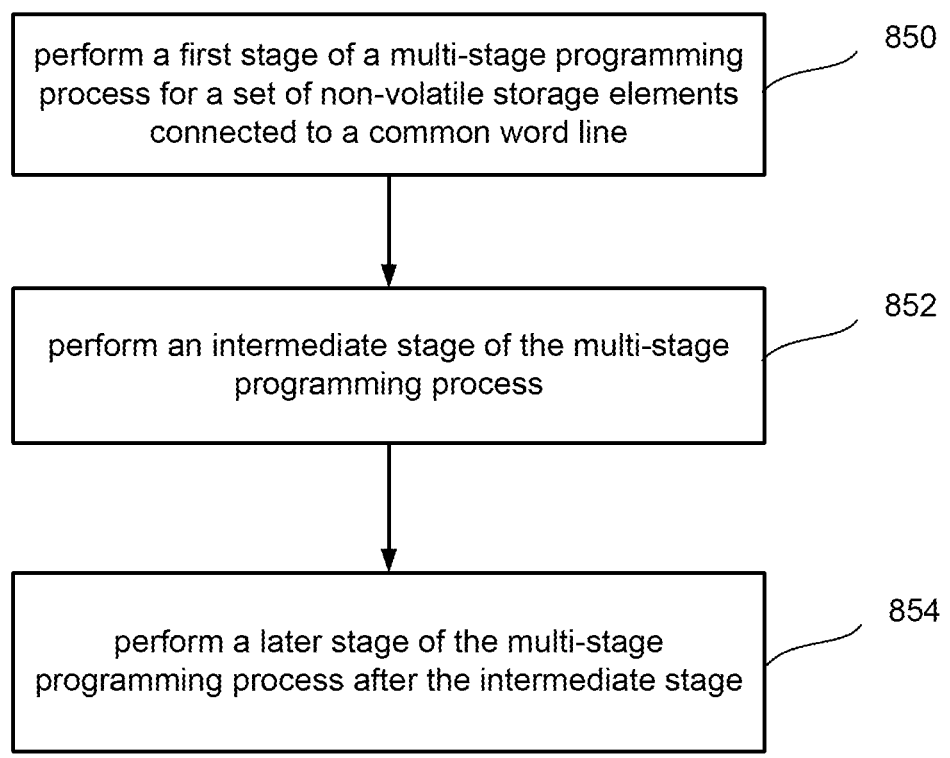
FIG. 13 is a flow chart describing a multi-stage programming according to one embodiment of the present technology.

FIG. 13 is a flow chart describing a multi-stage programming for a set of non-volatile storage elements according to one embodiment of the present technology that provides for precise programming, while reducing program disturb and floating gate to floating gate coupling. The process of FIG. 13 can be performed one or multiple times during step 556 of FIG. 7. For example, the process of FIG. 13 can be used to program memory cells connected to a common word line; therefore, if memory cells connected to X word lines are being programmed for a block, then the process of FIG. 13 is performed X times. In one embodiment, the process of FIG. 13 includes three stages, and each stage includes performing the process of FIG. 8 one or multiple times.

Prior to programming, the non-volatile storage elements are erased so that all memory cells connected to a common word line are in an erased threshold voltage distribution E. In step 850 of FIG. 13, a first stage of the multi-stage programming process is performed for the non-volatile storage elements to change threshold voltages of at least a subset of the memory cells from an erased distribution to intermediate threshold voltage distributions. The first stage of programming in step 850 is similar to the first stage of programming as depicted in FIG. 12A.

In step 852 of FIG. 13, an intermediate stage of the multi-stage programming process is performed for the non-volatile storage elements to change threshold voltages of at least some of the non-volatile storage elements to appropriate distributions of the target data threshold voltage distributions. In one embodiment, performing the intermediate stage comprises first programming a first subset of the non-volatile storage elements to upper state data threshold voltage distributions and subsequently programming a second subset of the non-volatile storage elements to lower state data threshold voltage distributions. For example, during the intermediate stage, those memory cells to be programmed to the upper data states S8 through SF are programmed first to appropriate distributions of the upper state data threshold voltage distributions, and those memory cells to be programmed to the lower data states S0 through S7 are subsequently programmed to appropriate distributions of the lower state data threshold voltage distributions after the programming to the upper state data threshold voltage distributions. FIGS. 14B-14C include one example implementation of step 852. FIG. 15B includes another example implementation of step 852. FIG. 16B includes yet another example implementation of step 852.

In step 854, a later stage of the multi-stage programming process is performed, after the intermediate stage, that tightens only a subset of the data threshold voltage distributions. In one embodiment, performing the later stage of the multi-stage programming process comprises tightening only the lower state data threshold voltage distributions without tightening the upper state data threshold voltage distributions. FIG. 14D includes one example implementation of step 854. FIGS. 15C-15D include another example implementation of step 854. FIGS. 16C-16D include yet another example implementation of step 854.

FIGS. 14A-14D describe a multi-stage programming for a set of non-volatile storage elements according to one embodiment of the present technology, and include one example implementation of steps 850, 852 and 854. In this embodiment, the programming process of FIGS. 14A-14D includes three stages. Prior to programming, the non-volatile storage elements are erased so that all memory cells connected to a common word line are in an erased threshold voltage distribution E. The first stage of programming as depicted in FIG. 14A programs at least a subset of the memory cells to intermediate threshold voltage distributions (e.g., IM_1, IM_2, and IM_3 as depicted in FIG. 14A), and is similar to the first stage of programming as depicted in FIG. 12A.

During the second stage (coarse programming) of the programming process of FIGS. 14A-14D, a first subset of the non-volatile storage elements are programmed first to upper state data threshold voltage distributions and a second set of the non-volatile storage elements are subsequently programmed to lower state data threshold voltage distributions after the programming of the first subset of the non-volatile storage elements to the upper state data threshold voltage distributions. In some embodiments, those memory cells that are to be programmed to data states S8 through SF are programmed first to appropriate distributions of the upper state data threshold voltage distributions. For example, as depicted graphically by FIG. 14B, those memory cells to be programmed to data state S8 are programmed from intermediate threshold voltage distribution IM_2 to a target data threshold voltage distribution for data state S8 having a target threshold voltage of Vv9, those memory cells to be programmed to data state S9 are programmed from intermediate threshold voltage distribution IM_2 to a target data threshold voltage distribution for data state S9 having a target threshold voltage of Vv10, those memory cells to be programmed to data state SA are programmed from intermediate threshold voltage distribution IM_2 to a target data threshold voltage distribution for data state SA having a target threshold voltage of Vv11, those memory cells to be programmed to data state SB are programmed from intermediate threshold voltage distribution IM_2 to a target data threshold voltage distribution for data state SB having a target threshold voltage of Vv12, those memory cells to be programmed to data state SC are programmed from intermediate threshold voltage distribution IM_3 to a target data threshold voltage distribution for data state SC having a target threshold voltage of Vv13, those memory cells to be programmed to data state SD are programmed from intermediate threshold voltage distribution IM_3 to a target data threshold voltage distribution for data state SD having a target threshold voltage of Vv14, those memory cells to be programmed to data state SE are programmed from intermediate threshold voltage distribution IM_3 to a target data threshold voltage distribution for data state SE having a target threshold voltage of Vv15, and those memory cells to be programmed to data state SF are programmed from the intermediate threshold voltage distribution IM_3 to a target data threshold voltage distribution for data state SF having a target threshold voltage of Vv16.

Subsequently in the second stage (coarse programming) of the programming process of FIGS. 14A-14E, those memory cells that are to be programmed to data states S0 through S7 are programmed to appropriate distributions of the lower state data threshold voltage distributions after the programming to the upper state data threshold voltage distributions for data states S8 through SF. For example, as depicted graphically by FIG. 14C, those memory cells to be programmed to data state S0 are programmed from the erased threshold voltage distribution E to a data threshold voltage distribution for data state S0 having a target threshold voltage of PT_0, those memory cells to be programmed to data state S1 are programmed from the erased threshold voltage distribution E to a data threshold voltage distribution for data state S1 having a target threshold voltage of PT_1, those memory cells to be programmed to data state S2 are programmed from the erased threshold voltage distribution E to a data threshold voltage distribution for data state S2 having a target threshold voltage of PT_2, those memory cells to be programmed to data state S3 are programmed from the erased threshold voltage distribution E to a data threshold voltage distribution for data state S3 having a target threshold voltage of PT_3, those memory cells to be programmed to data state S4 are programmed from intermediate threshold voltage distribution IM_1 to a data threshold voltage distribution for data state S4 having a target threshold voltage of PT_4, those memory cells to be programmed to data state S5 are programmed from intermediate threshold voltage distribution IM_1 to a data threshold voltage distribution for data state S5 having a target threshold voltage of PT_5, those memory cells to be programmed to data state S6 are programmed from intermediate threshold voltage distribution IM_1 to a data threshold voltage distribution for data state S6 having a target threshold voltage of PT_6, and those memory cells to be programmed to data state S7 are programmed from the intermediate threshold voltage distribution IM_1 to a data threshold voltage distribution for data state S7 having a target threshold voltage of PT_7. The second stage of the programming process as depicted graphically in FIGS. 14B-14C illustrates one example implementation of step 852 in FIG. 13.

In the third stage (fine programming) of the programming process of FIGS. 14A-14D, the data threshold voltage distributions for the lower data states are tightened without tightening the upper state data threshold voltage distributions. For example, as depicted in FIG. 14D, the data threshold voltage distribution for data state S0 is tightened to achieve a target threshold voltage distribution for data state S0 having a target threshold voltage of Vv1, the data threshold voltage distribution for data state S1 is tightened to achieve a target threshold voltage distribution for data state S1 having a target threshold voltage of Vv2, the data threshold voltage distribution for data state S2 is tightened to achieve a target threshold voltage distribution for data state S2 having a target threshold voltage of Vv3, the data threshold voltage distribution for data state S3 is tightened to achieve a target threshold voltage distribution for data state S3 having a target threshold voltage of Vv4, the data threshold voltage distribution for data state S4 is tightened to achieve a target threshold voltage distribution for data state S4 having a target threshold voltage of Vv5, the data threshold voltage distribution for data state S5 is tightened to achieve a target threshold voltage distribution for data state S5 having a target threshold voltage of Vv6, the data threshold voltage distribution for data state S6 is tightened to achieve a target threshold voltage distribution for data state S6 having a target threshold voltage of Vv7, and the data threshold voltage distribution for data state S7 is tightened to achieve a target threshold voltage distribution for data state S7 having a target threshold voltage of Vv8. The third stage of the programming process as depicted in FIG. 14D illustrates one example implementation of step 854 in FIG. 13.

As can be seen from FIGS. 14A-14D, the upper state data threshold voltage distributions are not tightened after the programming to lower state data threshold voltage distributions. As the lower data states are programmed last, they are not likely to suffer from program disturb cause by the upper data states.

FIGS. 15A-15D describe a multi-stage programming for a set of non-volatile storage elements according to another embodiment of the present technology, and include one example implementation of steps 850, 852 and 854. In this embodiment, the programming process of FIGS. 15A-15D includes three stages. Prior to programming, the non-volatile storage elements are erased so that all memory cells connected to a common word line are in an erased threshold voltage distribution E. The first stage of programming as depicted in FIG. 15A programs at least a subset of the memory cells to intermediate threshold voltage distributions (e.g., IM_1, IM_2, IM_3 as depicted in FIG. 15A), and is similar to the first stage of programming as depicted in FIG. 12A.

During the second stage (coarse programming) of the programming process of FIGS. 15A-15D, non-volatile storage elements are programmed to upper state data threshold voltage distributions without being programming to lower state data threshold voltage distributions. In some embodiments, those memory cells that are to be programmed to data states S8 through SF are programmed to appropriate distributions of the upper state data threshold voltage distributions during the second stage of the programming process. For example, as depicted graphically by FIG. 15B, those memory cells to be programmed to data state S8 are programmed from intermediate threshold voltage distribution IM_2 to a data threshold voltage distribution for data state S8 having a target threshold voltage of PT_8, those memory cells to be programmed to data state S9 are programmed from intermediate threshold voltage distribution IM_2 to a data threshold voltage distribution for data state S9 having a target threshold voltage of PT_9, those memory cells to be programmed to data state SA are programmed from intermediate threshold voltage distribution IM_2 to a data threshold voltage distribution for data state SA having a target threshold voltage of PT_A, those memory cells to be programmed to data state SB are programmed from intermediate threshold voltage distribution IM_2 to a data threshold voltage distribution for data state SB having a target threshold voltage of PT_B, those memory cells to be programmed to data state SC are programmed from intermediate threshold voltage distribution IM_3 to a data threshold voltage distribution for data state SC having a target threshold voltage of PT_C, those memory cells to be programmed to data state SD are programmed from intermediate threshold voltage distribution IM_3 to a data threshold voltage distribution for data state SD having a target threshold voltage of PT_D, those memory cells to be programmed to data state SE are programmed from intermediate threshold voltage distribution IM_3 to a data threshold voltage distribution for data state SE having a target threshold voltage of PT_E, and those memory cells to be programmed to data state SF are programmed from the intermediate threshold voltage distribution IM_3 to a data threshold voltage distribution for data state SF having a target threshold voltage of PT_F. The second stage of the programming process as depicted in FIG. 15B illustrates one example implementation of step 852 in FIG. 13.

During the second stage of the programming process of FIGS. 15A-15D, those memory cells that are to be programmed to data states S0 through S7 are not programmed. In some embodiments, those memory cells that are to be programmed to the data states S0 through S3 remain in the erased threshold voltage distribution E state during the second stage, and those memory cells that are to be programmed to the data states S4 through S7 remain in the intermediate threshold voltage distribution IM_1 during the second stage.

In the third stage (fine programming) of the programming process of FIGS. 15A-15D, the upper state data threshold voltage distributions are first tightened and non-volatile storage elements are subsequently programmed into the lower state data threshold voltage distributions after the tightening of the upper state data threshold voltage distributions. In some embodiments, the data threshold voltage distributions for data states S8 through SF are first tightened to achieve appropriate distributions of the target threshold voltage distributions during the third stage of the programming process. For example, as depicted in FIG. 15C, the data threshold voltage distribution for data state S8 is tightened to achieve a target threshold voltage distribution for data state S8 having a target threshold voltage of Vv9, the data threshold voltage distribution for data state S9 is tightened to achieve a target threshold voltage distribution for data state S9 having a target threshold voltage of Vv10, the data threshold voltage distribution for data state SA is tightened to achieve a target threshold voltage distribution for data state SA having a target threshold voltage of Vv11, the data threshold voltage distribution for data state SB is tightened to achieve a target threshold voltage distribution for data state SB having a target threshold voltage of Vv12, the data threshold voltage distribution for data state SC is tightened to achieve a target threshold voltage distribution for data state SC having a target threshold voltage of Vv13, the data threshold voltage distribution for data state SD is tightened to achieve a target threshold voltage distribution for data state SD having a target threshold voltage of Vv14, the data threshold voltage distribution for data state SE is tightened to achieve a target threshold voltage distribution for data state SE having a target threshold voltage of Vv15, and the data threshold voltage distribution for data state SF is tightened to achieve a target threshold voltage distribution for data state SF having a target threshold voltage of Vv16.

Subsequently in the third stage (fine programming) of the programming process of FIGS. 15A-15D, those memory cells that are to be programmed to data states S0 through S7 are programmed to appropriate distributions of the lower state data threshold voltage distributions after the tightening of the upper state data threshold voltage distributions for data states S8 through SF. For example, as depicted graphically by FIG. 15D, those memory cells to be programmed to data state S0 are programmed from the erased threshold voltage distribution E to a target data threshold voltage distribution for data state S0 having a target threshold voltage of Vv1, those memory cells to be programmed to data state S1 are programmed from the erased threshold voltage distribution E to a target data threshold voltage distribution for data state S1 having a target threshold voltage of Vv2, those memory cells to be programmed to data state S2 are programmed from the erased threshold voltage distribution E to a target data threshold voltage distribution for data state S2 having a target threshold voltage of Vv3, those memory cells to be programmed to data state S3 are programmed from the erased threshold voltage distribution E to a target data threshold voltage distribution for data state S3 having a target threshold voltage of Vv4, those memory cells to be programmed to data state S4 are programmed from intermediate threshold voltage distribution IM_1 to a target data threshold voltage distribution for data state S4 having a target threshold voltage of Vv5, those memory cells to be programmed to data state S5 are programmed from intermediate threshold voltage distribution IM_1 to a target data threshold voltage distribution for data state S5 having a target threshold voltage of Vv6, those memory cells to be programmed to data state S6 are programmed from intermediate threshold voltage distribution IM_1 to a target data threshold voltage distribution for data state S6 having a target threshold voltage of Vv7, and those memory cells to be programmed to data state S7 are programmed from the intermediate threshold voltage distribution IM_1 to a target data threshold voltage distribution for data state S7 having a target threshold voltage of Vv8. The third stage of the programming process as depicted in FIGS. 15C-15D illustrates one example implementation of step 854 in FIG. 13.

As can be seen from FIGS. 15A-15D, the upper state data threshold voltage distributions are not tightened after the programming to lower state data threshold voltage distributions. As the lower data states are programmed last, they are not likely to suffer from program disturb caused by the upper data states.

FIGS. 16A-16D describe a multi-stage programming for a set of non-volatile storage elements according to another embodiment of the present technology, and include one example implementation of steps 850, 852 and 854. In this embodiment, the programming process of FIGS. 16A-16D includes three stages. Prior to programming, the non-volatile storage elements are erased so that all memory cells connected to a common word line are in an erased threshold voltage distribution E. The first stage of programming as depicted in FIG. 16A programs at least a subset of the memory cells to intermediate threshold voltage distributions (e.g., IM_1, IM_2, IM_3 as depicted in FIG. 16A), and is similar to the first stage of programming as depicted in FIG. 12A.

During the second stage (coarse programming) of the programming process of FIGS. 16A-16D, non-volatile storage elements are programmed to upper state data threshold voltage distributions and a first set of lower state data threshold voltage distributions without being programmed to a second set of the lower state data threshold voltage distributions. In some embodiments, those memory cells that are to be programmed to data states S8 through SF are programmed to appropriate distributions of the upper state data threshold voltage distributions during the second stage of the programming process, and those memory cells that are to be programmed to data states S2 through S7 are programmed to appropriate distributions of a first set of the lower state data threshold voltage distributions. For example, as depicted graphically by FIG. 16B, those memory cells to be programmed to data state S8 are programmed from intermediate threshold voltage distribution IM_2 to a data threshold voltage distribution for data state S8 having a target threshold voltage of PT_8, those memory cells to be programmed to data state S9 are programmed from intermediate threshold voltage distribution IM_2 to a data threshold voltage distribution for data state S9 having a target threshold voltage of PT 9, those memory cells to be programmed to data state SA are programmed from intermediate threshold voltage distribution IM_2 to a data threshold voltage distribution for data state SA having a target threshold voltage of PT_A, those memory cells to be programmed to data state SB are programmed from intermediate threshold voltage distribution IM_2 to a data threshold voltage distribution for data state SB having a target threshold voltage of PT_B, those memory cells to be programmed to data state SC are programmed from intermediate threshold voltage distribution IM_3 to a data threshold voltage distribution for data state SC having a target threshold voltage of PT_C, those memory cells to be programmed to data state SD are programmed from intermediate threshold voltage distribution IM_3 to a data threshold voltage distribution for data state SD having a target threshold voltage of PT_D, those memory cells to be programmed to data state SE are programmed from intermediate threshold voltage distribution IM_3 to a data threshold voltage distribution for data state SE having a target threshold voltage of PT_E, and those memory cells to be programmed to data state SF are programmed from the intermediate threshold voltage distribution IM_3 to a data threshold voltage distribution for data state SF having a target threshold voltage of PT_F.

Also as depicted graphically by FIG. 16B, during the second stage of the programming process, those memory cells to be programmed to data state S2 are programmed from the erased threshold voltage distribution E to a data threshold voltage distribution for data state S2 having a target threshold voltage of PT_2, those memory cells to be programmed to data state S3 are programmed from the erased threshold voltage distribution E to a data threshold voltage distribution for data state S3 having a target threshold voltage of PT_3, those memory cells to be programmed to data state S4 are programmed from intermediate threshold voltage distribution IM_1 to a data threshold voltage distribution for data state S4 having a target threshold voltage of PT_4, those memory cells to be programmed to data state S5 are programmed from intermediate threshold voltage distribution IM_1 to a data threshold voltage distribution for data state S5 having a target threshold voltage of PT_5, those memory cells to be programmed to data state S6 are programmed from intermediate threshold voltage distribution IM_1 to a data threshold voltage distribution for data state S6 having a target threshold voltage of PT_6, those memory cells to be programmed to data state S7 are programmed from the intermediate threshold voltage distribution IM_1 to a data threshold voltage distribution for data state S7 having a target threshold voltage of PT_7. The second stage of the programming process as depicted in FIG. 16B illustrates one example implementation of step 852 in FIG. 13.

However, those memory cells that are to be programmed to the lowest data states S0 and S1 are not programmed during the second stage of the programming process of FIGS. 16A-16D, and therefore, remain in the erased threshold voltage distribution E state. As will be discussed below, the lowest data states S0 through S1 (the lowest data states S0 and S1 experience the most program disturb) are programmed last after all of the upper data states have completed programming.

In the third stage (fine programming) of the programming process of FIGS. 16A-16D, the upper state data threshold voltage distributions are first tightened and the first set of the lower state data threshold voltage distributions are subsequently tightened after the tightening of the upper state data threshold voltage distributions. Also, during the third stage of the programming process, non-volatile storage elements are subsequently programmed into the second set of the lower state data threshold voltage distributions after the tightening of the upper state data threshold voltage distributions.

In some embodiments, during the third stage of the programming process, the data threshold voltage distributions for upper data states S8 through SF are first tightened to achieve appropriate distributions of the target threshold voltage distributions for data states S8 through SF. For example, as depicted in FIG. 16C, the data threshold voltage distribution for data state S8 is tightened to achieve a target threshold voltage distribution for data state S8 having a target threshold voltage of Vv9, the data threshold voltage distribution for data state S9 is tightened to achieve a target threshold voltage distribution for data state S9 having a target threshold voltage of Vv10, the data threshold voltage distribution for data state SA is tightened to achieve a target threshold voltage distribution for data state SA having a target threshold voltage of Vv11, the data threshold voltage distribution for data state SB is tightened to achieve a target threshold voltage distribution for data state SB having a target threshold voltage of Vv12, the data threshold voltage distribution for data state SC is tightened to achieve a target threshold voltage distribution for data state SC having a target threshold voltage of Vv13, the data threshold voltage distribution for data state SD is tightened to achieve a target threshold voltage distribution for data state SD having a target threshold voltage of Vv14, the data threshold voltage distribution for data state SE is tightened to achieve a target threshold voltage distribution for data state SE having a target threshold voltage of Vv15, and the data threshold voltage distribution for data state SF is tightened to achieve a target threshold voltage distribution for data state SF having a target threshold voltage of Vv16.

Subsequently in the third stage (fine programming) of the programming process of FIGS. 16A-16D, the data threshold voltage distributions for the lower data states S2 through S7 are tightened after the tightening of the upper state data threshold voltage distributions for data states S8 through SF. For example, as depicted in FIG. 16D, the data threshold voltage distribution for data state S2 is tightened to achieve a target threshold voltage distribution for data state S2 having a target threshold voltage of Vv3, the data threshold voltage distribution for data state S3 is tightened to achieve a target threshold voltage distribution for data state S3 having a target threshold voltage of Vv4, the data threshold voltage distribution for data state S4 is tightened to achieve a target threshold voltage distribution for data state S4 having a target threshold voltage of Vv5, the data threshold voltage distribution for data state S5 is tightened to achieve a target threshold voltage distribution for data state S5 having a target threshold voltage of Vv6, the data threshold voltage distribution for data state S6 is tightened to achieve a target threshold voltage distribution for data state S6 having a target threshold voltage of Vv7, and the data threshold voltage distribution for data state S7 is tightened to achieve a target threshold voltage distribution for data state S7 having a target threshold voltage of Vv8.

Also, during the third stage of the programming process of FIGS. 16A-16D, those memory cells that are to be programmed to data states S0 through S1 are subsequently programmed to appropriate distributions of the lower state data threshold voltage distributions after the tightening of the upper state data threshold voltage distributions for data states S8 through SF. For example, as depicted graphically by FIG.

16D, those memory cells to be programmed to data state S0 are programmed from the erased threshold voltage distribution E to a target data threshold voltage distribution for data state S0 having a target threshold voltage of Vv1, and those memory cells to be programmed to data state S1 are programmed from the erased threshold voltage distribution E to a target data threshold voltage distribution for data state S1 having a target threshold voltage of Vv2. Since the two lowest data states S0 and S1 experience the most program disturb, the programming process of FIGS. 16A-16D ensures that the data states S0 and S1 are programmed last after all upper data states have completed. This reduces the overall program disturb. The third stage of the programming process as depicted in FIGS. 16C-16D illustrates one example implementation of step 854 in FIG. 13.

In the above example embodiments, data states S0 through SF are partitioned between data state S7 and data state S8 for the high-state-first programming. In some embodiments, the partition of data states S0 through SF for the high-state-first programming may be moved to other data states. For example, data states S0 through SF are partitioned between data state S3 and data state S4 such that data states S4 through SF are the upper data states for the high-state-first programming. In another example, data states S0 through SF are partitioned between data state SB and data state SC such that data states SC through SF are the upper data states for the high-state-first programming.

One embodiment includes a method of programming non-volatile storage to a set of data threshold voltage distributions, comprising performing a first stage of a multi-stage programming process for a set of non-volatile storage elements connected to a common word line to change threshold voltages of at least a subset of the non-volatile storage elements from an erased distribution to one or more intermediate distributions, performing an intermediate stage of the multi-stage programming process to change threshold voltages of at least some of the non-volatile storage elements to appropriate distributions of the data threshold voltage distributions, and performing a later stage of the multi-stage programming process that tightens only a subset of the data threshold voltage distributions after the intermediate stage.

One embodiment includes a plurality of non-volatile storage elements and one or more managing circuits in communication with the non-volatile storage elements to program the non-volatile storage elements to a set of data threshold voltage distributions. In order to programming the non-volatile storage elements, the one or more managing circuits perform a multi-stage programming process, including performing a first stage of the multi-stage programming process to change threshold voltages of at least a subset of the non-volatile storage elements from an erased distribution to one or more intermediate distributions, performing an intermediate stage of the multi-stage programming process to change threshold voltages of at least some of the non-volatile storage elements to appropriate distributions of the data threshold voltage distributions, and performing a later stage of the multi-stage programming process to tighten only a subset of the data threshold voltage distributions after performing the intermediate stage of the multi-stage programming process.

One embodiment includes performing a first stage of a multi-stage programming process for a set of non-volatile storage elements connected to a common word line to change threshold voltages of at least a subset of the non-volatile storage elements from an erased distribution to multiple intermediate distributions; performing an intermediate stage of the multi-stage programming process to change threshold voltages of the non-volatile storage elements to lower state data threshold voltage distributions and upper state data threshold voltage distributions; and performing a later stage of the multi-stage programming process, after the intermediate stage, that tightens only the lower state data threshold voltage distributions without tightening the upper state data threshold voltage distributions.

One embodiment includes performing a first stage of a multi-stage programming process to program non-volatile storage elements from an erased distribution to multiple intermediate distributions; performing an intermediate stage of the multi-stage programming process to program non-volatile storage elements to multiple distributions of a set of data threshold voltage distributions; and performing a later stage of the multi-stage programming process, after the intermediate stage, by first tightening upper state data threshold voltage distributions and subsequently tightening lower state data threshold voltage distributions.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method for programming non-volatile storage to a set of data threshold voltage distributions, comprising:
   performing a first stage of a multi-stage programming process for a set of non-volatile storage elements connected to a common word line to change threshold voltages of at least a subset of the non-volatile storage elements from an erased distribution to one or more intermediate distributions;
   performing an intermediate stage of the multi-stage programming process to change threshold voltages of at least some of the non-volatile storage elements to appropriate distributions of the data threshold voltage distributions; and
   performing a later stage of the multi-stage programming process, after the intermediate stage, that tightens only lower state data threshold voltage distributions without tightening upper state data threshold voltage distributions.

2. The method of claim 1, wherein:
   the performing the intermediate stage comprises programming non-volatile storage elements to all distributions of the data threshold voltage distributions.

3. The method of claim 1, wherein:
   the performing the intermediate stage comprises first programming a first subset of the non-volatile storage elements to upper state data threshold voltage distributions and subsequently programming a second subset of the non-volatile storage elements to lower state data threshold voltage distributions.

4. The method of claim 3, wherein:
   the upper state data threshold voltage distributions are not tightened after the programming of the second subset of the non-volatile storage elements to the lower state data threshold voltage distributions.

5. A method for programming non-volatile storage to a set of data threshold voltage distributions, comprising:
   performing a first stage of a multi-stage programming process for a set of non-volatile storage elements connected to a common word line to change threshold voltages of at least a subset of the non-volatile storage elements from an erased distribution to one or more intermediate distributions;

performing an intermediate stage of the multi-stage programming process to change threshold voltages of at least some of the non-volatile storage elements to appropriate distributions of the data threshold voltage distributions; and performing a later stage of the multi-stage programming process, after the intermediate stage, that tightens only a subset of the data threshold voltage distributions, wherein:

the performing the intermediate stage comprises programming non-volatile storage elements to upper state data threshold voltage distributions and a first set of lower state data threshold voltage distributions without programming non-volatile storage elements to a second set of the lower state data threshold voltage distributions; and the performing the later stage of the multi-stage programming process comprises:

tightening the upper state data threshold voltage distributions, tightening the first set of the lower state data threshold voltage distributions after tightening the upper state data threshold voltage distributions, and programming non-volatile storage elements into the second set of the lower state data threshold voltage distributions.

6. A method for programming non-volatile storage to a set of data threshold voltage distributions, comprising:

performing a first stage of a multi-stage programming process for a set of non-volatile storage elements connected to a common word line to change threshold voltages of at least a subset of the non-volatile storage elements from an erased distribution to one or more intermediate distributions;

performing an intermediate stage of the multi-stage programming process to change threshold voltages of at least some of the non-volatile storage elements to appropriate distributions of the data threshold voltage distributions; and performing a later stage of the multi-stage programming process, after the intermediate stage, that tightens only a subset of the data threshold voltage distributions, wherein:

the performing the intermediate stage comprises programming non-volatile storage elements to multiple distributions of the data threshold voltage distributions;

the performing the later stage of the multi-stage programming process comprises first tightening upper state data threshold voltage distributions and subsequently tightening lower state data threshold voltage distributions;

programming non-volatile storage elements to multiple distributions of the data threshold voltage distributions comprises programming non-volatile storage elements to the upper state data threshold voltage distributions and a first set of the lower state data threshold voltage distributions; and the performing the later stage of the multi-stage programming process comprises subsequently programming non-volatile storage elements into a second set of the lower state data threshold voltage distributions after the tightening of the upper state data threshold voltage distributions.

7. The method of claim 6, wherein:

the performing the intermediate stage comprises programming non-volatile storage elements to upper state data threshold voltage distributions without programming non-volatile storage elements to lower state data threshold voltage distributions; and the performing the later stage of the multi-stage programming process comprises tightening the upper state data threshold voltage distributions and subsequently programming non-volatile storage elements into the lower state data threshold voltage distributions.

8. The method of claim 7, wherein:

non-volatile storage elements are not programmed to the upper state data threshold voltage distributions and the upper state data threshold voltage distributions are not tightened after the programming of the non-volatile storage elements to the lower state data threshold voltage distributions.

9. A non-volatile storage system, comprising:

a plurality of non-volatile storage elements; and one or more managing circuits in communication with the non-volatile storage elements, said one or more managing circuits program the non-volatile storage elements to a set of data threshold voltage distributions by performing a multi-stage programming process including performing a first stage of the multi-stage programming process to change threshold voltages of at least a subset of the non-volatile storage elements from an erased distribution to one or more intermediate distributions, performing an intermediate stage of the multi-stage programming process to change threshold voltages of at least some of the non-volatile storage elements to appropriate distributions of the data threshold voltage distributions, and performing a later stage of the multi-stage programming process, after performing the intermediate stage of the multi-stage programming process, by tightening only lower state data threshold voltage distributions without tightening upper state data threshold voltage distributions.

10. The non-volatile storage system of claim 9, wherein:

the one or more managing circuits perform the intermediate stage of the multi-stage programming process by programming non-volatile storage elements to all distributions of the data threshold voltage distributions.

11. The non-volatile storage system of claim 9, wherein:

the one or more managing circuits perform the intermediate stage of the multi-stage programming process by first programming a first subset of the non-volatile storage elements to upper state data threshold voltage distributions and subsequently programming a second subset of the non-volatile storage elements to lower state data threshold voltage distributions.

12. The non-volatile storage system of claim 11, wherein:

the upper state data threshold voltage distributions are not tightened after the programming of the second subset of the non-volatile storage elements to the lower state data threshold voltage distributions.

13. The non-volatile storage system of claim 9, wherein:

the one or more managing circuits perform the intermediate stage by programming non-volatile storage elements to upper state data threshold voltage distributions without programming non-volatile storage elements to lower state data threshold voltage distributions; and the one or more managing circuits perform the later stage of the multi-stage programming process by tightening the upper state data threshold voltage distributions and subsequently programming non-volatile storage elements into the lower state data threshold voltage distributions.

14. The non-volatile storage system according to claim 9, wherein:
the plurality of non-volatile storage elements are flash memory devices.

15. The non-volatile storage system according to claim 9, wherein:
the plurality of non-volatile storage elements are multi-state flash memory devices.

16. The non-volatile storage system according to claim 9, wherein:
the plurality of non-volatile storage elements are NAND multi-state flash memory devices.

17. The non-volatile storage system according to claim 9, wherein:
the one or more managing circuits include any one or a combination of a controller, a state machine, a power control circuit, a command circuit, a control circuit and a decoder circuit.

18. A non-volatile storage system, comprising:
a plurality of non-volatile storage elements; and
one or more managing circuits in communication with the non-volatile storage elements, said one or more managing circuits program the non-volatile storage elements to a set of data threshold voltage distributions by performing a multi-stage programming process including performing a first stage of the multi-stage programming process to change threshold voltages of at least a subset of the non-volatile storage elements from an erased distribution to one or more intermediate distributions, performing an intermediate stage of the multi-stage programming process to change threshold voltages of at least some of the non-volatile storage elements to appropriate distributions of the data threshold voltage distributions, and performing a later stage of the multi-stage programming process, after performing the intermediate stage of the multi-stage programming process, to tighten only a subset of the data threshold voltage distributions, wherein:
the one or more managing circuits perform the intermediate stage by programming non-volatile storage elements to upper state data threshold voltage distributions and a first set of lower state data threshold voltage distributions without programming non-volatile storage elements to a second set of the lower state data threshold voltage distributions; and
the one or more managing circuits perform the later stage of the multi-stage programming process by first tightening the upper state data threshold voltage distributions, and subsequently tightening the first set of the lower state data threshold voltage distributions and programming non-volatile storage elements into the second set of the lower state data threshold voltage distributions after tightening the upper state data threshold voltage distributions.

19. A non-volatile storage system, comprising:
a plurality of non-volatile storage elements; and
one or more managing circuits in communication with the non-volatile storage elements, said one or more managing circuits program the non-volatile storage elements to a set of data threshold voltage distributions by performing a multi-stage programming process including performing a first stage of the multi-stage programming process to change threshold voltages of at least a subset of the non-volatile storage elements from an erased distribution to one or more intermediate distributions, performing an intermediate stage of the multi-stage programming process to change threshold voltages of at least some of the non-volatile storage elements to appropriate distributions of the data threshold voltage distributions, and performing a later stage of the multi-stage programming process, after performing the intermediate stage of the multi-stage programming process, to tighten only a subset of the data threshold voltage distributions, wherein:
the one or more managing circuits program non-volatile storage elements to multiple distributions of the data threshold voltage distributions by programming non-volatile storage elements to upper state data threshold voltage distributions and the first set of the lower state data threshold voltage distributions;
the one or more managing circuits perform the later stage of the multi-stage programming process by subsequently programming non-volatile storage elements into a second set of the lower state data threshold voltage distributions after the tightening of the upper state data threshold voltage distributions;
the one or more managing circuits perform the intermediate stage by programming non-volatile storage elements to multiple distributions of the data threshold voltage distributions; and
the one or more managing circuits perform the later stage of the multi-stage programming process by first tightening upper state data threshold voltage distributions and subsequently tightening a first set of lower state data threshold voltage distributions.

20. A method for programming non-volatile storage to a set of data threshold voltage distributions, comprising:
performing a first stage of a multi-stage programming process for a set of non-volatile storage elements connected to a common word line to change threshold voltages of at least a subset of the non-volatile storage elements from an erased distribution to multiple intermediate distributions;
performing an intermediate stage of the multi-stage programming process to change threshold voltages of the non-volatile storage elements to lower state data threshold voltage distributions and upper state data threshold voltage distributions; and
performing a later stage of the multi-stage programming process, after the intermediate stage, that tightens only the lower state data threshold voltage distributions without tightening the upper state data threshold voltage distributions.

21. The method of claim 20, wherein:
performing the intermediate stage of the multi-stage programming process comprises:
programming a first subset of the non-volatile storage elements to the upper state data threshold voltage distributions, and
subsequently programming a second subset of the non-volatile storage elements to the lower state data threshold voltage distributions after the programming of the first subset of the non-volatile storage elements to the upper state data threshold voltage distributions;
performing the later stage of the multi-stage programming process comprises tightening the lower state data threshold voltage distributions without tightening the upper state data threshold voltage distributions.

22. The method of claim 21, wherein:
the upper state data threshold voltage distributions are not tightened after the programming of the second subset of the non-volatile storage elements to the lower state data threshold voltage distributions.

23. A method for programming a set of non-volatile storage elements, comprising:

performing a first stage of a multi-stage programming process to program non-volatile storage elements from an erased distribution to multiple intermediate distributions;

performing an intermediate stage of the multi-stage programming process to program non-volatile storage elements to multiple distributions of a set of data threshold voltage distributions; and performing a later stage of the multi-stage programming process, after the intermediate stage, by first tightening upper state data threshold voltage distributions and subsequently tightening lower state data threshold voltage distributions.

* * * * *